United States Patent
Loo et al.

(10) Patent No.: US 9,699,904 B2
(45) Date of Patent: Jul. 4, 2017

(54) MICROELECTRONIC DEVICE ATTACHMENT ON A REVERSE MICROELECTRONIC PACKAGE

(75) Inventors: Howe Yin Loo, Sungai Petani (MY); Choong Kooi Chee, Balik Pulau (MY)

(73) Assignee: Intel Corporation, Santa Clara, CA (US)

( * ) Notice: Subject to any disclaimer, the term of this patent is extended or adjusted under 35 U.S.C. 154(b) by 120 days.

(21) Appl. No.: 13/993,343

(22) PCT Filed: Mar. 13, 2012

(86) PCT No.: PCT/MY2012/000055
§ 371 (c)(1),
(2), (4) Date: Mar. 19, 2014

(87) PCT Pub. No.: WO2013/137710
PCT Pub. Date: Sep. 19, 2013

(65) Prior Publication Data
US 2014/0293563 A1    Oct. 2, 2014

(51) Int. Cl.
*H05K 7/10*    (2006.01)
*H05K 1/18*    (2006.01)
(Continued)

(52) U.S. Cl.
CPC ............. *H05K 1/181* (2013.01); *H01L 23/13* (2013.01); *H01L 23/3677* (2013.01);
(Continued)

(58) Field of Classification Search
CPC ....... H01L 2224/16; H01L 2225/06517; H01L 2225/0652; H01L 23/13; H01L 23/3677;
(Continued)

(56) References Cited

U.S. PATENT DOCUMENTS

| | | |
|---|---|---|
| 4,704,592 A | 11/1987 | Marth et al. |
| 5,821,762 A | 10/1998 | Hamaguchi et al. |

(Continued)

FOREIGN PATENT DOCUMENTS

| | | |
|---|---|---|
| CN | 1663043 A | 8/2005 |
| CN | 101188225 A | 5/2008 |

(Continued)

OTHER PUBLICATIONS

International Search Report and Written Opinion for PCT Patent Application No. PCT/MY2012/000055, mailed on Nov. 23, 2012, 11 pages.

(Continued)

*Primary Examiner* — Yuriy Semenenko
(74) *Attorney, Agent, or Firm* — Winkle, PLLC

(57) ABSTRACT

The present description relates to the field of fabricating microelectronic structures. The microelectronic structure may include a microelectronic substrate have an opening, wherein the opening may be formed through the microelectronic substrate or may be a recess formed in the microelectronic substrate. A microelectronic package may be attached to the microelectronic substrate, wherein the microelectronic package may include an interposer having a first surface and an opposing second surface. A microelectronic device may be attached to the interposer first surface and the interposer may be attached to the microelectronic substrate by the interposer first surface such that the microelectronic device extends into the opening. At least one secondary microelectronic device may be attached to the interposer second surface.

13 Claims, 5 Drawing Sheets

(51) Int. Cl.
*H01L 23/13* (2006.01)
*H01L 23/367* (2006.01)
*H01L 23/498* (2006.01)
*H01L 25/065* (2006.01)
*H05K 3/30* (2006.01)
*H01L 23/427* (2006.01)
*H05K 1/14* (2006.01)
*H05K 3/34* (2006.01)

(52) U.S. Cl.
CPC .... *H01L 23/49827* (2013.01); *H01L 25/0652* (2013.01); *H05K 1/141* (2013.01); *H05K 3/30* (2013.01); *H01L 23/427* (2013.01); *H01L 2224/16* (2013.01); *H01L 2225/0652* (2013.01); *H01L 2225/06517* (2013.01); *H05K 1/144* (2013.01); *H05K 3/3415* (2013.01); *H05K 2201/10378* (2013.01); *Y10T 29/4913* (2015.01)

(58) Field of Classification Search
CPC .............. H01L 23/427; H01L 23/49827; H01L 25/0652; H05K 1/141; H05K 1/144; H05K 1/181; H05K 2201/10378; H05K 3/30; H05K 3/34
USPC ................................... 361/767, 760; 174/260
See application file for complete search history.

(56) References Cited

U.S. PATENT DOCUMENTS

| | | | |
|---|---|---|---|
| 6,423,570 B1 | 7/2002 | Ma et al. | |
| 2003/0128522 A1* | 7/2003 | Takeda | H01L 23/345 361/715 |
| 2004/0060732 A1* | 4/2004 | Giri | H01L 25/0652 174/260 |
| 2006/0214745 A1 | 9/2006 | Park et al. | |
| 2008/0002380 A1 | 1/2008 | Hazucha et al. | |
| 2008/0007925 A1* | 1/2008 | Kariya | H01L 23/49822 361/760 |
| 2008/0150110 A1* | 6/2008 | Kim | H01L 23/13 257/685 |
| 2008/0237789 A1 | 10/2008 | He et al. | |
| 2011/0203836 A1 | 8/2011 | Yokota et al. | |
| 2011/0210444 A1* | 9/2011 | Jeng | H01L 23/13 257/738 |
| 2014/0251669 A1 | 9/2014 | Manusharow et al. | |

FOREIGN PATENT DOCUMENTS

| | | |
|---|---|---|
| CN | 102169875 A | 8/2011 |
| JP | 2010-523001 A | 7/2010 |
| WO | 2013/162519 A1 | 10/2013 |
| WO | 2013/137710 A1 | 9/2014 |

OTHER PUBLICATIONS

International Search Report and Written Opinion received for PCT Patent Application No. PCT/US2012/34798, mailed on Dec. 14, 2012, 9 pages.

International Preliminary Report on Patentability and Written Opinion received for PCT Patent Application No. PCT/MY2012/000055, mailed on Sep. 25, 2014, 8 pages.

International Preliminary Report on Patentability and Written Opinion received for PCT Patent Application No. PCT/US2012/034798, mailed on Nov. 6, 2014, 6 pages.

Office Action received for Chinese Patent Application No. 201280071413.8, mailed on Jul. 26, 2016, 7 pages of Chinese Office Action.

Office Action received for Chinese Patent Application No. 201280071413.8, mailed on Mar. 15, 2017, 5 pages of Chinese Office Action Only.

* cited by examiner

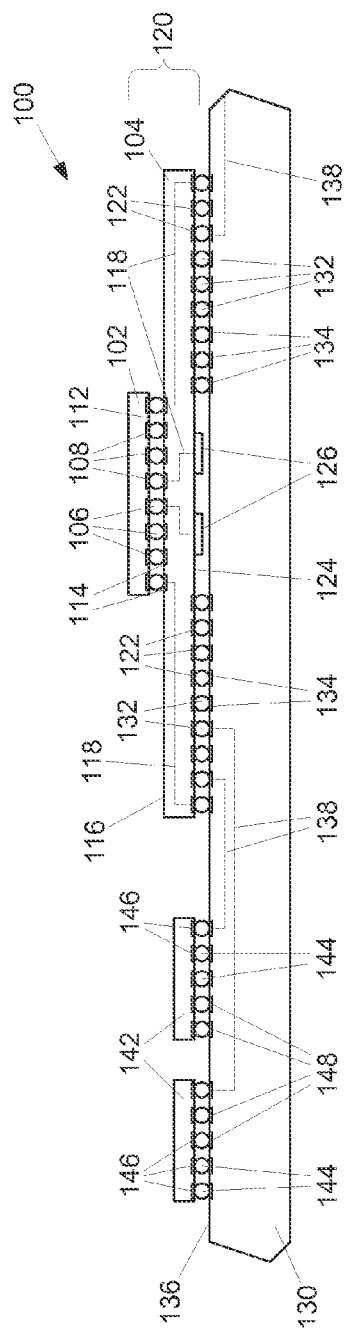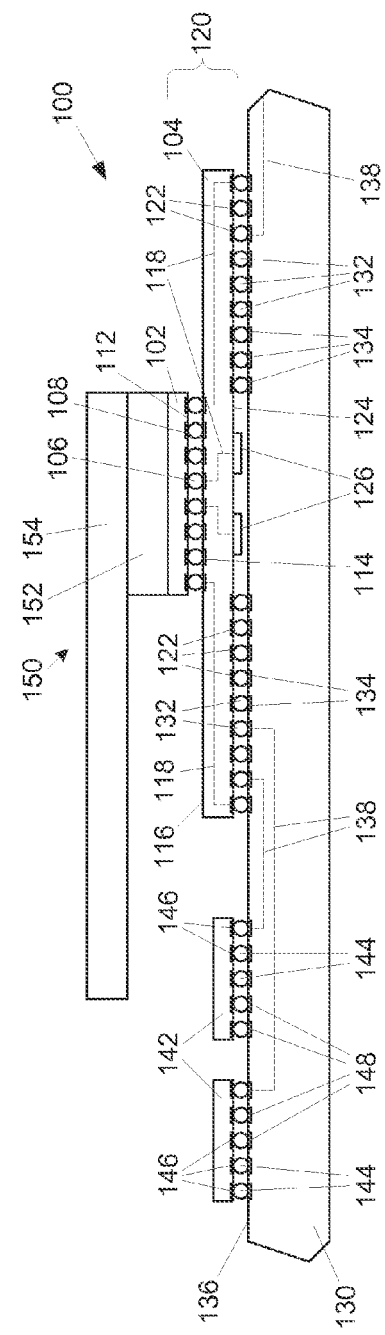
FIG. 1 (Prior Art)
FIG. 2 (Prior Art)

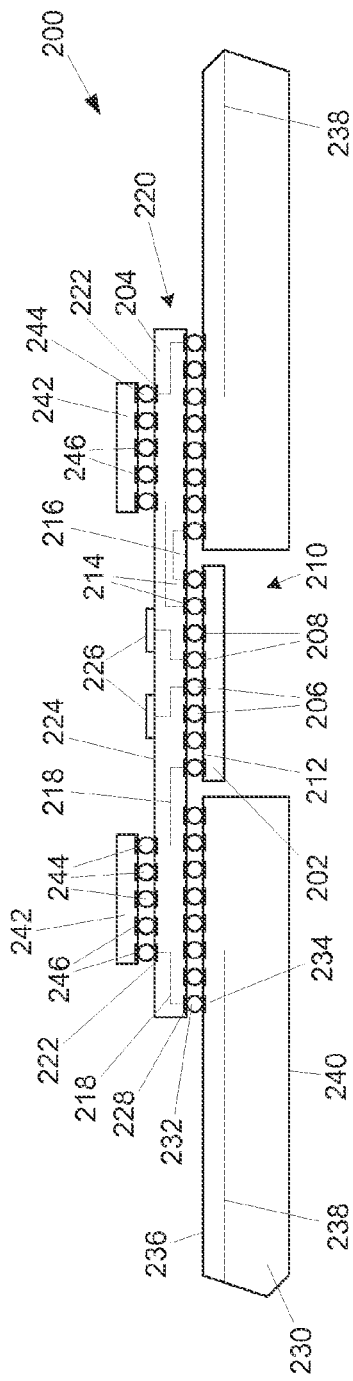
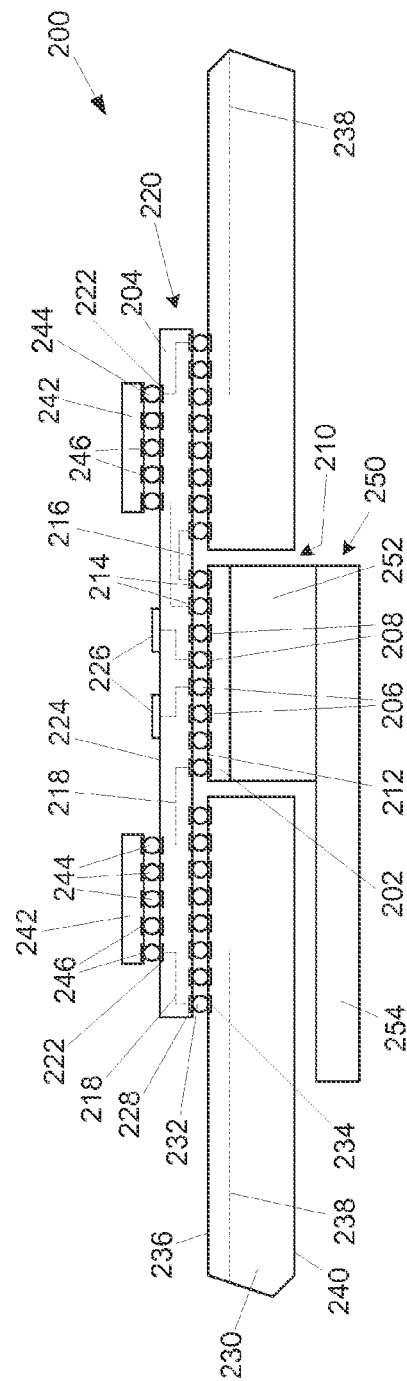

MICROELECTRONIC DEVICE ATTACHMENT ON A REVERSE MICROELECTRONIC PACKAGE

BACKGROUND OF THE INVENTION

Embodiments of the present description generally relate to the field of microelectronic packages and, more particularly, to the reverse attachment of a microelectronic package on a substrate and at least one secondary microelectronic device attached to the microelectronic package.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIG. 1 illustrates a side cross-sectional view of a microelectronic package mounted on a microelectronic substrate, as known in the art.

FIG. 2 illustrates a side cross-sectional view of the structure of FIG. 1 with a heat dissipation device in contact with the microelectronic package, as known in the art.

FIG. 3 illustrates a side cross-sectional view of a microelectronic package reverse mounted on a microelectronic substrate with at least one microelectronic device of the microelectronic package extending into an opening in the microelectronic substrate, according to one embodiment of the present description.

FIG. 4 illustrates a side cross-sectional view of the structure of FIG. 3 with a heat dissipation device in contact with the microelectronic device of the microelectronic package, according to one embodiment of the present description.

DETAILED DESCRIPTION OF THE INVENTION

Figure 5:
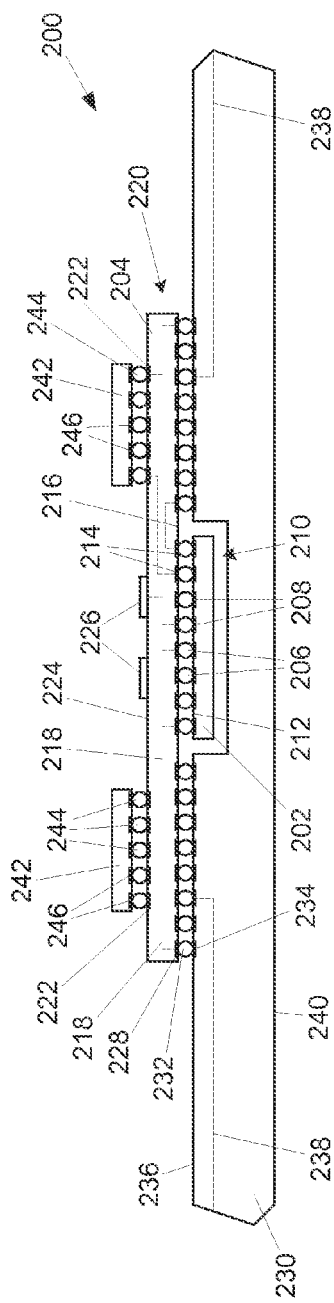
FIG. 5 illustrates a side cross-sectional view of a microelectronic package reverse mounted on a microelectronic substrate with at least one microelectronic device of the microelectronic package extending into a recess in the microelectronic substrate, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of fabricating microelectronic structures. The microelectronic structure may include a microelectronic substrate have an opening, wherein the opening may be formed through the microelectronic substrate or may be a recess formed in the microelectronic substrate. A microelectronic package may be attached to the microelectronic substrate, wherein the microelectronic package may include an interposer having a first surface and an opposing second surface. A microelectronic device may be attached to the interposer first surface and the interposer may be attached to the microelectronic substrate by the interposer first surface such that the microelectronic device extends into the opening. At least one secondary microelectronic device may be attached to the interposer second surface.

In the production of microelectronic structures, microelectronic packages are generally mounted on microelectronic substrates that provide electrical communication routes between the microelectronic packages and external components. As shown in FIG. 1, a microelectronic device 102, such as a microprocessor, a chipset, a graphics device, a wireless device, a memory device, an application specific integrated circuit, or the like, may be attached to a microelectronic interposer 104 through a plurality of interconnects 106, to form a microelectronic package 120. The device-to-interposer interconnects 106 may extend between bond pads 108 on an active surface 112 of the microelectronic device 102 and substantially mirror-image bond pads 114 on a device attachment surface 116 of the microelectronic interposer 104. The microelectronic device bond pads 108 may be in electrical communication with integrated circuitry (not shown) within the microelectronic device 102. The microelectronic interposer bond pads 114 may be in electrical communication with conductive routes (shown as dashed lines 118) within the microelectronic interposer 104. The interposer conductive routes 118 provide electrical communication routes to bond pads 122 on a substrate attachment surface 124 of the microelectronic interposer 104.

The microelectronic interposer 104 and its respective interposer conductive routes 118 may be made of multiple layers of conductive traces, such as copper or aluminum, built up on and through dielectric layers, such as epoxy, which are laminated on either side of the matrix core, such as fiberglass or epoxy. Furthermore, passive devices 126, such as resistors, capacitors, and inductors, may be attached to the microelectronic interposer substrate attachment surface 124 and in electrical communication with the microelectronic device 102 through respective interposer conductive routes 118.

As further shown in FIG. 1, the microelectronic package 120 may be mounted on a microelectronic substrate 130, such as a motherboard, which may provide electrical communication routes between the microelectronic package 120 and external components. The microelectronic package 120 may be attached to the microelectronic substrate 130 through a plurality of interconnects 132, to form a microelectronic structure 100. The interposer-to-substrate interconnects 132 may extend between the microelectronic interposer substrate attachment surface bond pads 122 and substantially mirror-image bond pads 134 on a first surface 136 of the microelectronic substrate 130. The microelectronic substrate first surface bond pads 134 may be in electrical communication with conductive routes (shown as dashed lines 138) on or within the microelectronic substrate 130. The microelectronic substrate conductive routes 138 provide electrical communication routes to external components, such as secondary microelectronic devices 142. The secondary microelectronic devices 142 may be attached to by interconnects 144 extending between bond pads 146 on the secondary microelectronic devices 142 and secondary bond pads 148 on the microelectronic substrate 130. The secondary microelectronic devices 142 may include, but is not limited to, a microprocessor, a chipset, a graphics device, a wireless device, a memory device, an application specific integrated circuit, or the like.

As it may be seen from FIG. 1, the arrangement of components in the microelectronic structure 100 may take considerable space, which may be difficult to accommodate in small form-factor mobile devices, such as cell phones, computer tablets, and laptop computers. Furthermore, when heat needs to be removed from the microelectronic device 102, such as by a heat dissipation device 150 (illustrated in FIG. 2 as the heat spreader 152 coupled to a heat pipe 154), the thickness of the arrangement of the components in the microelectronic structure 100 may also make it difficult to accommodate in small form-factor devices.

In one embodiment of a microelectronic structures of the present description is illustrated in FIG. 3. As shown in FIG. 3, a microelectronic device 202, such as a microprocessor, a chipset, a graphics device, a wireless device, a memory device, an application specific integrated circuit, or the like, may be attached to a microelectronic interposer 204 through a plurality of interconnects 206, to form a microelectronic package 220. The device-to-interposer interconnects 206 may extend between bond pads 208 on a first surface 212 of the microelectronic device 202 and substantially mirror-image bond pads 214 on a first surface 216 of the microelectronic interposer 204. The microelectronic device bond pads 208 may be in electrical communication with integrated circuitry (not shown) within the microelectronic device 202. The microelectronic interposer bond pads 214 may be in electrical communication with conductive routes (shown as dashed lines 218) within the microelectronic interposer 204. The interposer conductive routes 218 provide electrical communication routes to bond pads 222 on a second surface 224 of the microelectronic interposer 204.

Although the device-to-interposer interconnects 206 are shown as reflowable solder bumps or balls, in a configuration generally known as a flip-chip or controlled collapse chip connection ("C4") configuration, the interconnects may be pins, lands, or bond wires, as known in the art. The microelectronic interposer 204 and its respective interposer conductive routes 218 may be made of multiple layers of conductive traces, such as copper or aluminum, built up on and through dielectric layers, such as epoxy, which are laminated on either side of the matrix core, such as fiberglass or epoxy.

As further shown in FIG. 3, an opening 210 may be formed in a microelectronic substrate 230, such as a motherboard, which may provide electrical communication routes between the microelectronic package 220 and external components. In one embodiment, the microelectronic substrate opening 210 may extend through the microelectronic substrate 230, as illustrated, from a first surface 236 of the microelectronic substrate 230 to a second surface 240 of the microelectronic substrate 230. The microelectronic package 220 may be mounted on the microelectronic substrate first surface 236 in a reverse configuration such that the microelectronic device 202 extends into the microelectronic substrate opening 210. The microelectronic package 220 may be attached to the microelectronic substrate 230 through a plurality of interconnects 232, to form a microelectronic structure 200. The interposer-to-substrate interconnects 232 may extend between bond pads 228 on the microelectronic interposer first surface 216 and substantially mirror-image bond pads 234 on a first surface 236 of the microelectronic substrate 230. The microelectronic substrate bond pads 234 may be in electrical communication with conductive routes (shown as dashed lines 238) on or within the microelectronic substrate 230. The microelectronic substrate conductive routes 238 provide electrical communication routes to external components (not shown).

At least one secondary microelectronic device 242 may be attached to the microelectronic interposer second surface 224 by interconnects 244 extending between bond pads 246 on the secondary microelectronic devices 242 and bond pads 222 on the microelectronic interposer second surface 224. The secondary microelectronic devices 242 may include, but is not limited to, a microprocessor, a chipset, a graphics device, a wireless device, a memory device, an application specific integrated circuit, or the like. In one embodiment, the microelectronic device 202 may be a microprocessor and the secondary microelectronic device 242 may be a memory device. Furthermore, passive devices 226, such as resistors, capacitors, and inductors, may be attached to the microelectronic interposer second surface 224 and in electrical communication with the microelectronic device 202 through respective interposer conductive routes 218.

Although the interposer-to-substrate interconnects 232 are shown as reflowable solder bumps or balls, they may be pins or lands, as known in the art. Furthermore, although the secondary microelectronic device-to-substrate interconnects 244 are shown as reflowable solder bumps or balls, they may be pins, lands, or wire bonds, as known in the art.

The microelectronic substrate 230 may be primarily composed of any appropriate material, including, but not limited to, bismaleimine triazine resin, fire retardant grade 4 material, polyimide materials, glass reinforced epoxy matrix material, and the like, as well as laminates or multiple layers thereof. The microelectronic substrate conductive routes 238 may be composed of any conductive material, including but not limited to metals, such as copper and aluminum, and alloys thereof. As will be understood to those skilled in the art, the microelectronic substrate conductive routes 238 may be formed as a plurality of conductive traces (not shown) formed on layers of dielectric material (constituting the layers of the microelectronic substrate material), which are connected by conductive vias (not shown).

When solder balls or bumps are used to form the device-to-interposer interconnects 206, the interposer-to-substrate interconnects 232, and/or the secondary microelectronic device-to-interposer interconnects 244, the solder any appropriate material, including, but not limited to, lead/tin alloys and high tin content alloys (e.g. about 90% or more tin), and similar alloys. The solder may be reflowed, either by heat, pressure, and/or sonic energy.

As it may be seen from FIG. 4, when heat needs to be removed from the microelectronic device 202, a heat dissipation device 250 (illustrated as the heat spreader 252 coupled to a heat pipe 254) may extend into the microelectronic substrate opening 210 to the thermally contact the microelectronic device 202. By extending the heat dissipation device 250 into the microelectronic substrate opening 210, the thickness of the arrangement of the components in the microelectronic structure 200 may be reduced In another embodiment of the present description shown in FIG. 5, the microelectronic substrate opening 210 may be a recess extending into the microelectronic substrate 230 from the microelectronic substrate first surface 236.

Figure 6:
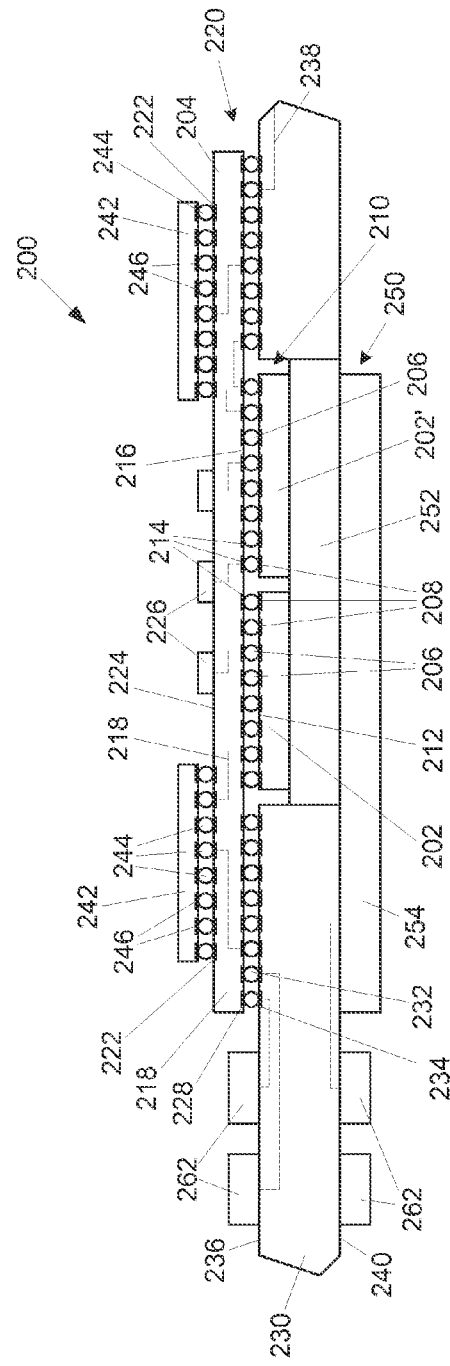
FIG. 6 illustrates a side cross-sectional view of a microelectronic package reverse mounted on a microelectronic substrate with a plurality of microelectronic devices of the microelectronic package extending into an opening in the microelectronic substrate with a heat dissipation device in contact with the microelectronic devices, according to one embodiment of the present description.

It is understood that embodiments of the present description may include numerous configurations. As shown in FIG. 6, a plurality of microelectronic devices (shown as 202 and 202') may extend into the microelectronic substrate opening 210. A portion of the heat dissipation device 250 may be incorporated into the microelectronic substrate 230, such as being attached thereto. The microelectronic substrate 230 may be double sided, such that addition microelectronic devices 262 may be attached to the microelectronic substrate first surface 236 and/or the microelectronic substrate second surface 240.

Embodiment of the present description may substantially reduce the amount of space required on a microelectronic substrate over attaching secondary microelectronic devices on the microelectronic substrate. Furthermore, where high density interconnection board routing is required between the secondary microelectronic device and the microelectronic device attached to the microelectronic interposer, which may reduce the cost of the microelectronic structure. Particularly when the secondary microelectronic device is a memory device and the microelectronic device attached to the microelectronic interposer is a microprocessor. Moreover, the reduction in space required on the microelectronic substrate may allow for larger battery size of specific platforms, such as electronic tablets and ultra-book platforms.

Figure 7:
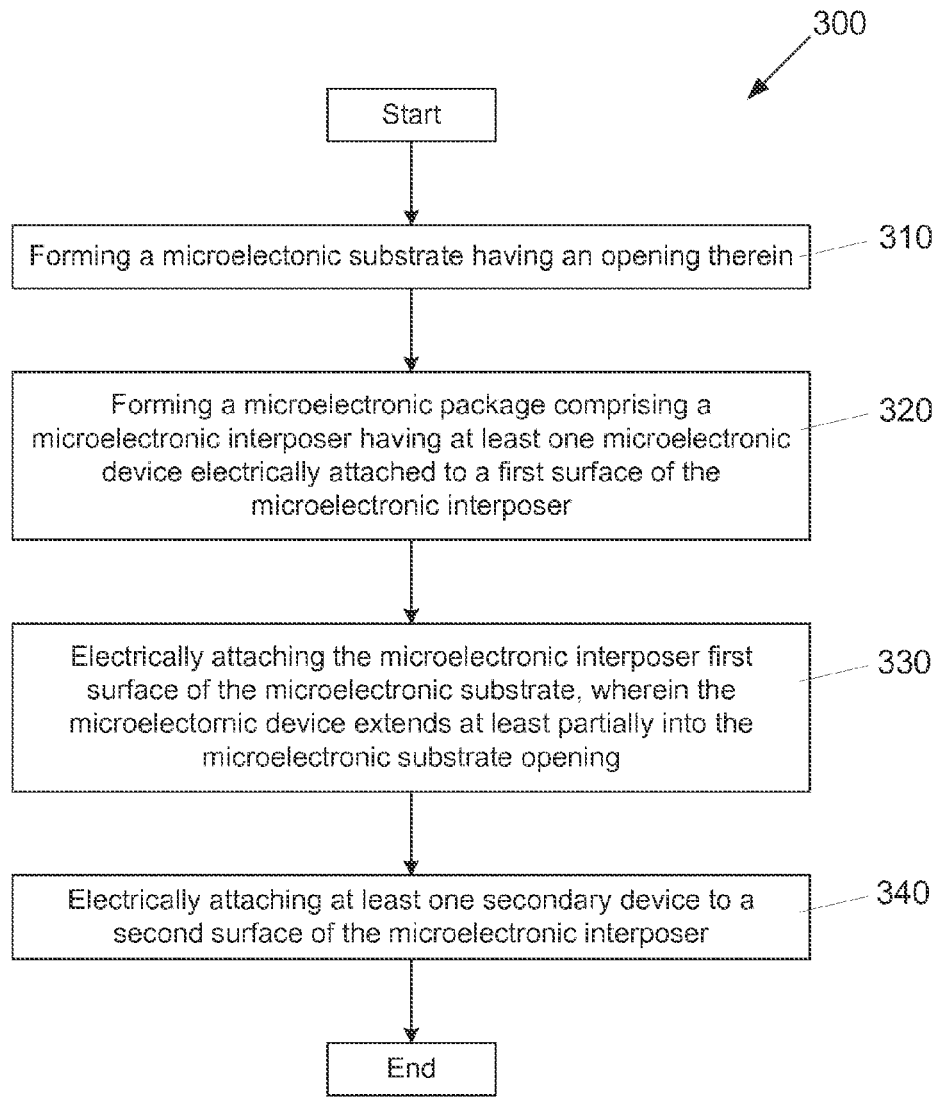
FIG. 7 is a flow diagram of a process of fabricating a microelectronic structure, according to an embodiment of the present description.

An embodiment of one process of fabricating a microelectronic structure of the present description is illustrated in a flow diagram 300 of FIG. 7. As defined in block 310, a microelectronic substrate having an opening therein may be formed. A microelectronic package may be formed comprising a microelectronic interposer having at least one microelectronic device electrically attached to a first surface of the microelectronic interposer, as defined in block 320. As defined in block 330, the microelectronic interposer first surface may be electrically attached to a first surface of the microelectronic substrate, wherein the microelectronic device is positioned to extend at least partially into the microelectronic substrate opening. At least one secondary device may be attached to a second surface of the microelectronic interposer, as defined in block 340.

Figure 8:
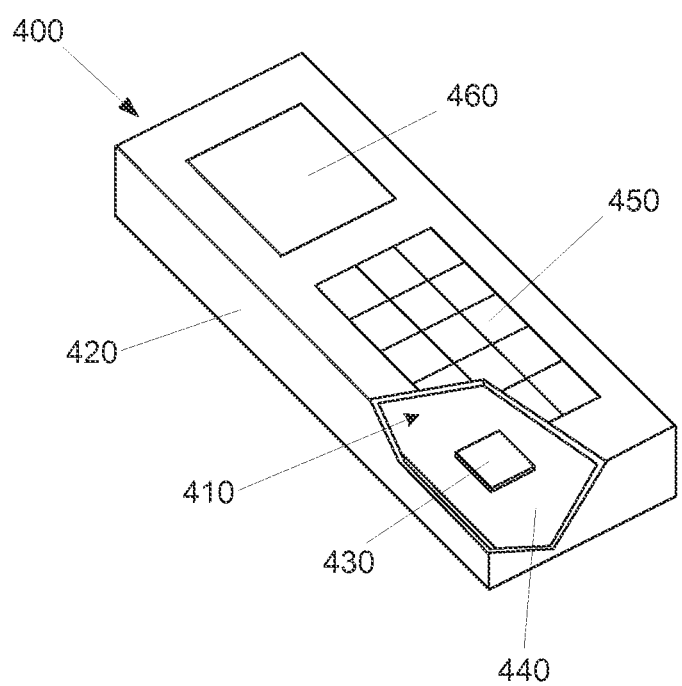
FIG. 8 illustrates an electronic system/device, according to one implementation of the present description.

FIG. 8 illustrates an embodiment of a electronic system/device 400, such as a portable computer, a desktop computer, a mobile telephone, a digital camera, a digital music player, a web tablet/pad device, a personal digital assistant, a pager, an instant messaging device, or other devices. The electronic system/device 400 may be adapted to transmit and/or receive information wirelessly, such as through a wireless local area network (WLAN) system, a wireless personal area network (WPAN) system, and/or a cellular network. The electronic system/device 400 may include a microelectronic structure 410 (such as the microelectronic structure 200 in FIGS. 3-6) within a housing 420. As with the embodiments of the present application, the microelectronic structure 410 may includes a microelectronic substrate 440 having an opening (see element 210 of FIGS. 3-6) therein and a microelectronic package 430 including a microelectronic interposer (see element 204 of FIGS. 3-6) having at least one microelectronic device (see element 202 of FIGS. 3-6) electrically attached to a first surface thereof, wherein the microelectronic package 430 is electrically attached to the microelectronic substrate 410 by the microelectronic interposer first surface and wherein the microelectronic device extends at least partially into the microelectronic substrate opening; and at least one secondary microelectronic device (see element 202 of FIGS. 3-6) attached to a second surface of the microelectronic interposer. The microelectronic substrate 410 may be attached to various peripheral devices including an input device 450, such as keypad, and a display device 460, such an LCD display. It is understood that the display device 460 may also function as the input device, if the display device 460 is touch sensitive.

It is understood that the subject matter of the present description is not necessarily limited to specific applications illustrated in FIGS. 1-8. The subject matter may be applied to other microelectronic device fabrication applications, as will be understood to those skilled in the art.

Having thus described in detail embodiments of the present invention, it is understood that the invention defined by the appended claims is not to be limited by particular details set forth in the above description, as many apparent variations thereof are possible without departing from the scope thereof.

The invention claimed is:

1. A microelectronic structure, comprising:
   a microelectronic substrate having a first surface, a second surface, and an opening extending from the microelectronic substrate first surface and the microelectronic substrate second surface;
   a microelectronic package comprising a microelectronic interposer having at least one microelectronic device electrically attached to a first surface of the microelectronic interposer, wherein the microelectronic package is electrically attached to the microelectronic substrate first surface by the microelectronic interposer first surface and wherein the at least one microelectronic device extends at least partially into the microelectronic substrate opening; and
   a heat dissipation device in thermal contact with the microelectronic device, wherein the heat dissipation device comprises a heat spreader couple to a heat pipe, wherein at least a portion of the heat spreader extends into the microelectronic substrate opening; and wherein the heat pipe is external to the microelectronic substrate opening and extends over the microelectronic substrate second surface.

2. The microelectronic structure of claim 1, further including at least one secondary microelectronic device attached to a second surface of the microelectronic interposer.

3. The microelectronic structure of claim 2, wherein the microelectronic device comprises a microprocessor and the secondary microelectronic device comprises a memory device.

4. The microelectronic structure of claim 1, wherein at least a portion of the heat spreader dissipation device is incorporated into the microelectronic substrate.

5. The microelectronic structure of claim 1, further including at least one passive device attached to the microelectronic interposer second surface.

6. The microelectronic structure of claim 1, wherein the heat spreader abuts the microelectronic substrate within the microelectronic substrate opening.

7. The microelectronic structure of claim 1, wherein the heat spreader is attached to the microelectronic substrate within the microelectronic substrate opening.

8. The microelectronic structure of claim 1, wherein the microelectronic substrate includes at least one additional microelectronic device attached to a first surface of the microelectronic substrate.

9. The microelectronic structure of claim 1, wherein the microelectronic substrate includes at least one additional microelectronic device attached to a second surface of the microelectronic substrate.

10. The microelectronic structure of claim 1, wherein the microelectronic substrate includes conductive routes thereon or therein.

11. The microelectronic structure of claim 1, wherein the microelectronic interposer includes conductive routes thereon or therein.

12. The microelectronic structure of claim 1, wherein the at least one microelectronic device is attached to the first surface of the microelectronic interposer with a plurality of solder balls.

13. The microelectronic structure of claim 2, wherein the at least one secondary microelectronic device is attached to the second surface of the microelectronic interposer with a plurality of solder balls.

* * * * *